(12) United States Patent
Kojima

(10) Patent No.: US 7,990,183 B2
(45) Date of Patent: Aug. 2, 2011

(54) DIFFERENTIAL COMPARATOR WITH SKEW COMPENSATION FUNCTION AND TEST APPARATUS USING THE SAME

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 393 days.

(21) Appl. No.: 12/337,566

(22) Filed: Dec. 17, 2008

(65) Prior Publication Data
US 2010/0148826 A1     Jun. 17, 2010

(51) Int. Cl.
*H03K 5/22* (2006.01)
(52) U.S. Cl. ............... 327/63; 327/64; 327/65; 327/77; 327/91
(58) Field of Classification Search ............ 327/63–65, 327/77, 80, 91, 94; 324/762.01, 76.15
See application file for complete search history.

(56) References Cited

U.S. PATENT DOCUMENTS

| | | | | |
|---|---|---|---|---|
| 5,113,090 A * | 5/1992 | Imaizumi et al. | ............... | 327/91 |
| 6,909,980 B2 | 6/2005 | Fernando | ............... | 702/66 |
| 7,121,132 B2 | 10/2006 | Ibane | ............... | 73/1.42 |
| 7,397,289 B2 * | 7/2008 | Kojima | ............... | 327/161 |
| 7,541,845 B2 * | 6/2009 | Noh | ............... | 327/91 |
| 7,772,892 B2 * | 8/2010 | Kojima | ............... | 327/65 |
| 7,847,576 B2 * | 12/2010 | Kojima | ............... | 324/762.01 |

FOREIGN PATENT DOCUMENTS
JP     WO 2005/081004 A1     1/2005

* cited by examiner

*Primary Examiner* — Long Nguyen
(74) *Attorney, Agent, or Firm* — Martine Penilla & Gencarella, LLP

(57) ABSTRACT

One of differential signals is inputted to a first input terminal. The other of the differential signals is inputted to a second input terminal. A first sample hold circuit samples the signal inputted to the first input terminal and hold it thereafter. A second sample hold circuit samples the signal inputted to the second input terminal and holds it thereafter. A comparison unit compares a signal corresponding to a difference between respective output signals from the first and the second sample hold circuits, with a predetermined threshold value. A latch circuit latches an output from the comparison unit. Sample timings of the first and the second sample hold circuits and a latch timing of the latch circuit can be adjusted independently.

7 Claims, 11 Drawing Sheets

FIG.1
(a)
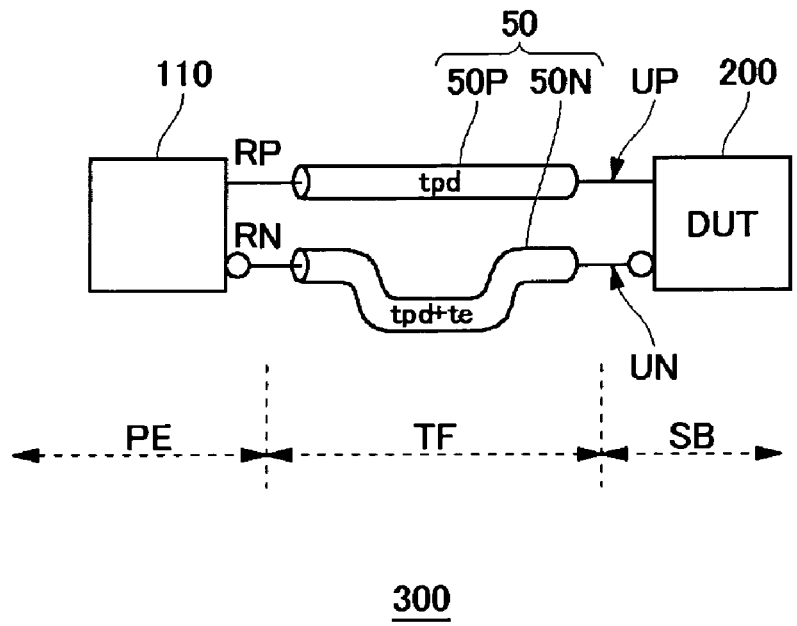
(b)
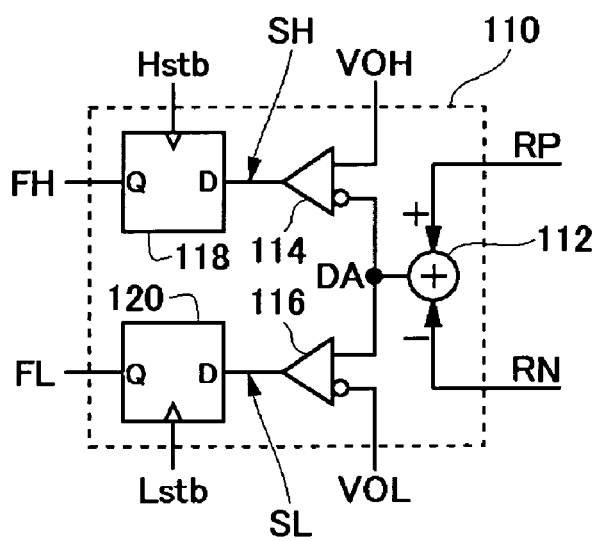

DIFFERENTIAL COMPARATOR WITH SKEW COMPENSATION FUNCTION AND TEST APPARATUS USING THE SAME

BACKGROUND OF THE INVENTION

1. Field of the Invention

The present invention relates to a technique for testing a semiconductor device, in particular, to a technique for evaluating signals with a differential form outputted from a device to be tested.

2. Description of the Related Art

In recent years, differential transmission systems have been widely used among digital home appliances such as TV sets, DVD (Digital Versatile Disc) players, in order to transmit video signals and audio signals at high speeds. The differential transmission systems are expected to be used in data transmission among devices such as memories and CPUs (Central Processing Units) in the near future.

FIGS. 1A and 1B are block diagrams illustrating part of a structure of a test apparatus for testing a device with a differential interface. As illustrated in FIG. 1A, a test system 300 is provided with a pin electronics PE and a test fixture TF. The DUT 200 is fixed to a socket board (SB). The pin electronics PE is provided with a differential comparator 110. The differential comparator 110 is also referred to as a timing comparator, which receives differential signals UP/UN outputted from the DUT 200, and determines levels of the differential signals UP/UN at a timing synchronized with a strobe signal. Herein, "P/N" represents a pair of differential signals. A pair of differential signal wires 50P/50N (hereinafter, also referred to collectively as differential signal wires 50) that connects the socket board SB and the pin electronics PE, is provided on the test fixture TF.

FIG. 1B is a circuit diagram illustrating the structure of the differential comparator 110. The differential comparator 110 includes a subtractor 112, a first comparator 114, a second comparator 116, a first latch 118, and a second latch 120. The subtractor 112 generates a difference between the differential signals RP and RN, that is, a differential amplitude signal DA. The first comparator 114 compares the differential amplitude signal DA with a higher threshold voltage VOH. The first latch 118 latches a comparison result SH at a timing of a first strobe signal Hstb. The second comparator 116 compares the differential amplitude signal DA with a lower threshold voltage VOL. The second latch 120 latches a comparison result SL at a timing of a second strobe signal Lstb. Logic values of the data SH and SL indicating the comparison results are determined based on the following equations (1A) and (1B):

$$SH = \text{sign}(VOH - (RP - RN)) \tag{1A}$$

$$SL = \text{sign}((RP - RN) - VOL) \tag{1B}$$

wherein, sign(x) is a function of which value is 1 when x>0, and 0 when x<0.

Ideally, lengths of the pair of the differential signal wires 50 formed on the test fixture TF are the same; however, in an actual test apparatus, the lengths thereof are sometimes different. FIGS. 2A and 2B are charts illustrating operation waveforms of the differential comparator 110 in the cases where the lengths of the differential lines are the same or different, respectively. As illustrated in FIG. 2A, in the case where the lengths of the differential signal wires 50 are the same, the differential signals UP/UN outputted from the DUT 200 reach the differential comparator 110 with the same delay of tpd (RP/RN).

Vertical axes and horizontal axes of time charts illustrated herein are appropriately expanded or contracted, in order to be understood easily; and each waveform illustrated herein is also simplified for the same purpose. In the time charts, "X" indicates a value is invalid.

Transition from the low-level to the high-level of the differential amplitude signal (RP−RN) is taken into consideration. The outputs SH and SL from the two comparators 114 and 116 are latched at timings of the strobe signals Hstb and Lstb, between them a time difference Tcr being present.

Based on a combination of the latched signals (fail signals) FH and FL, a transition time T from a low-level (<VOL) to a high-level (>VOH) of the differential amplitude signal (RP−RN) is determined whether the time T is shorter than a predetermined value Tcr or not. In FIG. 2A, signals FH and FL are both at the low-levels; hence, it is determined that T<Trc holds.

FIG. 2B illustrates the case where the lengths of the differential signal wires 50P/50N are different, and a delay amount of the differential signal UN is larger by a predetermined time te than that of the differential signal UP. In the case, a waveform of the differential amplitude signal (RP−RN) that is expected to have been outputted properly from the DUT 200 becomes weak within the test apparatus, such that the fail signal FH is determined to be at the high-level and the fail signal FL to be at the low-level; therefore, the transition time T is determined erroneously to be larger than the predetermined value Tcr.

For example, when a variable-length coaxial cable (trombone) is provided on a pathway in series to the test fixture TF, an imbalance between the differential lines can be canceled by changing a length of the coaxial cable. However, the variable-length coaxial cable is expensive and large-sized; hence it is unrealistic that the variable-length coaxial cable is provided to each differential line of a test apparatus, in particular, a test apparatus provided with hundreds to thousands of channels. Further, the variable-length coaxial cable is a device of which line length is changed mechanically, and hence the cable is difficult to be adjusted quickly.

The whole differential signal wires 50 may also be formed by using lines excellent in a symmetrical property, such as twisted pair; however, in the case, when a phase difference or an asymmetric property is present in the differential signals UP/UN from the DUT 200, the signals are averaged during propagation, making it difficult to evaluate a true waveform from the DUT 200 on the side of the test apparatus. It is an original advantage with the differential line that an asymmetric property of waveforms is averaged on the way of the transmission line; however, it becomes a disadvantage from a viewpoint of a test apparatus.

Other techniques to address an imbalance between differential line lengths are disclosed in Patent Documents 1 to 3.
[Patent Document 1] U.S. Pat. No. 7,397,289
[Patent Document 2] U.S. Pat. No. 6,909,980B2
[Patent Document 3] International Publication Pamphlet No. 05/081004
[Patent Document 4] U.S. Pat. No. 7,121,132

SUMMARY OF THE INVENTION

The present invention has been made under these situations, and one of exemplary purposes thereof is to provide a differential comparator capable of canceling an imbalance between differential lines by using an approach different from conventional ones.

An embodiment of the present invention relates to a differential comparator that receives differential signals outputted from a device to be tested, and compares a differential amplitude of the differential signals with a predetermined threshold voltage. The differential comparator comprises: a first input terminal to which one of differential signals is inputted; a second input terminal to which the other of the differential signals is inputted; a first sample hold circuit that samples the signal inputted to the first input terminal at a designated timing, and holds it thereafter; a second sample hold circuit that samples the signal inputted to the second input terminal at a designated timing, and holds it thereafter; a comparison unit that compares a signal corresponding to a difference between respective output signals from the first and the second sample hold circuits, with a predetermined threshold value; and a latch circuit that latches an output from the comparison unit. Sampling timings of the first and the second sample hold circuits, and a latch timing of the latch circuit, can be adjusted independently. A device to be tested and the differential comparator are connected with a pair of differential lines consisting of a positive wire and a negative wire, of which line lengths are sometimes different. In the case, an error in the line lengths can be canceled by adjusting the sampling timings of the first and the second sample hold circuits in accordance with a difference between the line lengths. This means that pure differential signals outputted from a device to be tested can be evaluated properly.

In an embodiment of the invention, the first sample hold circuit may include: a first capacitor an electric potential at one end of which is fixed; a second capacitor an electric potential at one end of which is fixed; a first switch provided between the other end of the first capacitor and the first input terminal; a second switch provided between the other end of the first capacitor and the other end of the second capacitor; a first voltage source that generates a first reference voltage by shifting a predetermined voltage in an amount of an electric potential difference corresponding to the threshold voltage; and a third switch provided between the first voltage source and the other end of the second capacitor. The first sample hold circuit may execute the following steps 1 to 3 in synchronization with the inputted strobe signal: step 1: the second switch is in an off state, and the first and the third switches are in on states; step 2: the first and the third switches are turned off; and step 3: the first and the third switches are in off states, and the second switch is in an on state. The second sample hold circuit may include: a third capacitor an electric potential at one end of which is fixed; a fourth capacitor an electric potential at one end of which is fixed; a fourth switch provided between the other end of the third capacitor and the second input terminal; a fifth switch provided between the other end of the third capacitor and the other end of the fourth capacitor; a second voltage source that generates a second reference voltage by shifting a predetermined voltage in an amount of an electric potential difference corresponding to the threshold voltage; and a sixth switch provided between the second voltage source and the other end of the fourth capacitor. The second sample hold circuit may execute the following steps in synchronization with the strobe signal: step 1: the fifth switch is in an off state, and the fourth and the sixth switches are in on states; step 2: the fourth and the sixth switches are turned off; and step 3: the fourth and the sixth switches are in off states, and the fifth switch is in an on state. The comparison unit may also compare a voltage generated in the second capacitor with a voltage generated in the fourth capacitor. The latch circuit may latch an output from the comparison unit at a timing corresponding to the strobe signal.

In an embodiment of the invention, the differential comparator may further comprise a dummy comparator to which an electric potential generated in the first capacitor and an electric potential generated in the third capacitor are inputted.

The first sample hold circuit may include: a seventh switch of which one end is connected to the first input terminal; a fifth capacitor of which one end is connected to the other end of the seventh switch; a third voltage source that generates a third reference voltage by shifting a predetermined voltage in an amount of an electric potential difference corresponding to the threshold voltage; an eighth switch provided between one end of the fifth capacitor and the third voltage source; a fourth voltage source that generates a fourth reference voltage; and a ninth switch provided between the other end of the fifth capacitor and the fourth voltage source. The first sample hold circuit executes the following steps 1 to 3 in synchronization with the strobe signal: step 1: the eighth switch is in an off state, and the seventh and the ninth switches are in on states; step 2: the seventh and the ninth switches are turned off; and step 3: the eighth switch is in an on state while the seventh and the ninth switches are in off states. The second sample hold circuit may also include: a tenth switch of which one end is connected to the second input terminal; a sixth capacitor of which one end is connected to the other end of the tenth switch; a fifth voltage source that generates a fifth reference voltage by shifting a predetermined voltage in an amount of an electric potential difference corresponding to the threshold voltage; an eleventh switch provided between one end of the sixth capacitor (first terminal) and the fifth voltage source; and a twelfth switch provided between the other end of the sixth capacitor and the fourth voltage source. The second sample hold circuit executes the following steps 1 to 3 in synchronization with the strobe signal: step 1: the tenth and the twelfth switches are in on states while the eleventh switch is in an off state; step 2: the tenth and the twelfth switches are turned off; and step 3: the eleventh switch is in an on state while the tenth and the twelfth switches are in off states. The comparison unit may compare a voltage generated at the other end of the fifth capacitor with a voltage generated at the other end of the sixth capacitor. The latch circuit may latch an output from the comparison unit at a timing corresponding to the strobe signal.

In an embodiment of the invention, the first and the second sample hold circuits may also include, instead of the ninth and the twelfth switches and the fourth voltage source: a differential amplifier that receives an electric potential at the other end of the fifth capacitor and an electric potential at the other end of the sixth capacitor; a thirteenth switch provided between a non-inverted input terminal and an inverted output terminal of the differential amplifier; and a fourteenth switch provided between an inverted input terminal and a non-inverted output terminal of the differential amplifier. The comparison unit may compare an electric potential at the inverted output terminal with an electric potential at the non-inverted output terminal of the differential amplifier.

In an embodiment of the invention, the comparison unit may compare respective output signals from the first and the second sample hold circuits with each other, instead of comparing a signal corresponding to a difference between the respective output signals from the first and the second sample hold circuits, with a predetermined threshold value. In the case, a magnitude comparison between the differential signals can be evaluated properly with an error in the wire lengths of the differential lines being canceled.

Another embodiment of the present invention relates to a test apparatus. The test apparatus comprises: the differential comparator according to any one of the comparators stated above that receives differential signals outputted from a device to be tested, and compares a differential amplitude of the differential signals with a predetermined higher threshold voltage; and the differential comparator according to any one of the comparators stated above that compares the differential amplitude of the differential signals with a predetermined lower threshold voltage.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 1A and 1B are block diagrams illustrating part of the structure of a test apparatus with a differential interface, the test apparatus being used for testing a device;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Herein, "the state where a member A is connected to a member B" includes not only the state where the member A is physically and directly connected to the member B but also the state where the member A is indirectly connected to the member B via another member that does not affect electrically the connection state between them. Likewise, "the state where a member C is provided between a member A and a member B" includes not only the state where the member A and the member C, or the member B and the member C, are connected directly, but also the state where they are connected indirectly via another member that does not affect electrically the connection state between them.

Figure 3:
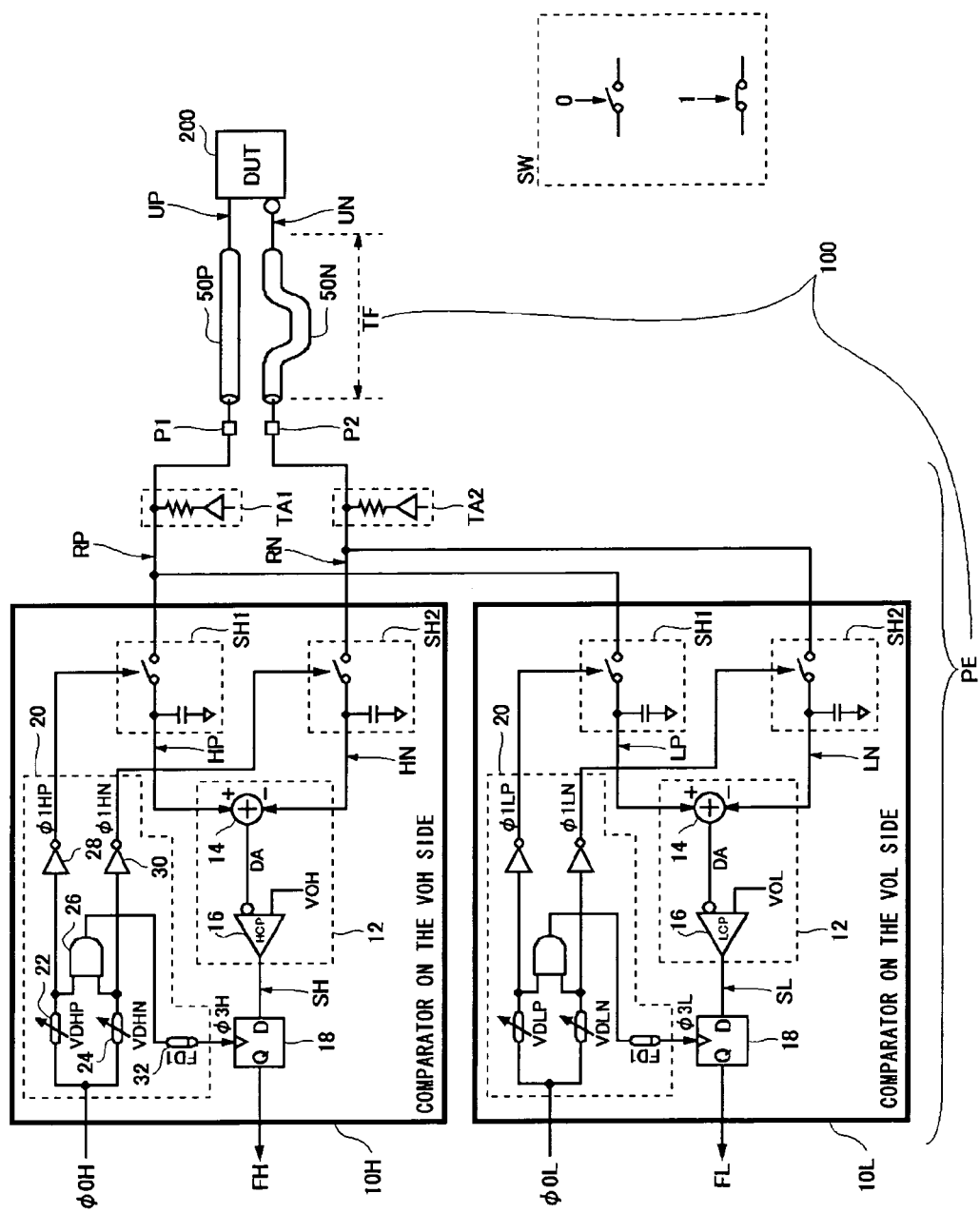
FIG. 3 is a circuit diagram illustrating part of the structure of a test apparatus directed to an embodiment.

FIG. 3 is a circuit diagram illustrating part of the structure of the test apparatus 100 directed to the embodiments. The test apparatus 100 is provided with the pin electronics PE and the test fixture TF. The DUT 200 outputs output signals UP/UN with a differential form (hereinafter, simply referred to as differential signals). The differential signals UP/UN are inputted to the first input terminal P1 and the second input terminal P2 of the pin electronics PE via the differential signal wires 50P/50N formed in the test fixture TF.

The pin electronics PE includes the High-side differential comparator 10H and the Low-side differential comparator 10L. The pin electronics PE serves as a timing comparator that evaluates levels of the differential signals based on timings of inputted strobe signals ϕ0H and ϕ0L.

The differential comparator 10H compares a differential amplitude component DA (=RP−RN) of the differential signals RP/RN thus received, with a predetermined high threshold voltage VOH. The differential comparator 10L compares the differential amplitude component (RP−RN) with a predetermined low threshold voltage VOL.

The differential comparators 10H and 10L have the same structures, and therefore a description will be made hereinafter taking only the High-side differential comparator 10H into consideration. The Low-side differential comparator 10L will be understood when the suffix "H" of the symbols noted to each signal and member is replaced with "L". In addition, a switch SW illustrated herein are meant to be turned off when 0 (low-level) is inputted as a control signal, and to be turned on when 1 (high-level) is inputted, as illustrated by the symbol in lower right of FIG. 3. As such a switch, an analogue switch, for example, transfer gate or the like, can be used suitably.

The differential comparator 10H includes a first input terminal P1, a second input terminal P2, a first sample hold circuit SH1, a second sample hold circuit SH2, a comparison unit 12, a latch circuit 18, a timing control unit 20, a first termination amplifier TA1, and a second termination amplifier TA2.

A non-inverted component (hereinafter, referred to as a positive signal) RP, one of the received differential signals RP/RN, is inputted to the first input terminal P1. An inverted component (hereinafter, referred to as a negative signal) RN, the other of the received differential signals RP/RN, is inputted to the second input terminal P2.

The first termination amplifier TA1 and the second termination amplifier TA2 are connected to the first input terminal P1 and the second input terminal P2, respectively, and the differential signal wires 50P/50N originating from the DUT 200 are terminated at the terminals P1 and P2. In the case where bidirectional transmission is carried out between the test apparatus 100 and the DUT 200, a driver outputting data to the DUT 200 may be provided instead of the termination amplifier.

The first sample hold circuit SH1 samples the positive signal RP inputted to the first input terminal P1 at a timing (for example, a timing of the positive edge) designated by the first control signal (hold signal) ϕ1HP, and subsequently holds the sampled value RPH (hold mode). During a period preceding the sampling timing, an output signal HP from the first sample hold circuit SH1 agrees with the inputted positive signal RP (tracking mode).

Likewise, the second sample hold circuit SH2 samples the negative signal RN inputted to the second input terminal P2 at a timing (for example, a timing of the positive edge) designated by the second control signal (hold signal) ϕ1HN, and subsequently holds the sampled value RNH (hold mode). During a period preceding the sampling timing, an output signal HN from the second sample hold circuit SH2 agrees with the inputted negative signal RN (tracking mode).

In other words, the first and the second sample hold circuits SH1 and SH2 serve as outputting (tracking) the inputted signals as they are, and as sampling and holding the signals at designated timings.

In FIG. 3, the first and the second sample hold circuits SH1 and SH2 are in the tracking modes when a switch SW is turned on, and sample and hold the sampled values when the switch SW is turned off. The first and the second sample hold circuits SH1 and SH2 include switches SW and capacitors C, respectively, but the structures thereof are not limited to that of FIG. 3, and the modification examples, which will be described later, and other structures not described herein may also be adopted.

The comparison unit 12 compares a difference between the output signal (hold positive signal) HP from the first sample hold circuit SH1 and the output signal (hold negative signal) HN from the second sample hold circuit SH2, or a differential amplitude signal DA corresponding to a differential amplitude (HP−HN), with the higher threshold voltage VOH. As a result of the comparison, a comparison signal SH, which is at the low-level when (HP−HN)>VOH and at the high-level when (HP−HN)<VOH, is outputted.

In FIG. 3, the comparison unit 12 is structured so as to include the subtractor 14 and the comparator 16. The subtractor 14 subtracts the hold negative signal HN from the hold positive signal HP in an analog fashion. For example, the subtractor 14 may also be a subtractor including a combination of a resistance and an operating amplifier, or another type of subtractors. The comparator 16 compares the differential amplitude signal DA outputted from the subtractor 14 with the threshold voltage VOH. As illustrated by various modification examples described later, the structure of the comparison unit 12 is not limited to that in FIG. 3.

The latch circuit 18 latches the comparison signal SH at a timing (for example, positive edge) corresponding to a third control signal φ3H. The fail signal FH thus latched is inputted to a decision circuit (not illustrated).

The timing control unit 20 generates the control signals φ1HP, φ1HN, and φ3H, based on the strobe signal φ0H that is inputted from outside and is a reference signal, and controls the first sample hold circuit SH1, the second sample hold circuit SH2, and the latch circuit 18. A transition timing of each of the control signals φ1HP, φ1HN, and φ3H can be adjusted arbitrarily. That is, sampling timings of the first sample hold circuit SH1 and the second sample hold circuit SH2, and a latch timing of the latch circuit 18, can be adjusted independently.

The timing control unit 20 includes a first delay circuit 22, a second delay circuit 24, a first AND gate 26, a first inverter 28, a second inverter 30, and a third delay circuit 32. The first delay circuit 22 and the second delay circuit 24 branch the strobe signal φ0H, each of which provides a first and a second variable delays VDHP and VDHN to the strobe signal φ0H. The first inverter 28 inverts an output signal from the corresponding first delay circuit 22, and outputs the inverted signal to the first sample hold circuit SH1 as the first control signal φ1HP. The second inverter 30 inverts an output signal from the corresponding second delay circuit 24, and outputs the inverted signal to the second sample hold circuit SH2 as the second control signal φ1HN.

The first AND gate 26 generates an AND of the output signals from the first delay circuit 22 and the second delay circuit 24. An output signal from the first AND gate 26 makes a transition following either the first control signal φ1HP or the second control signal φ1HN, which makes a transition later than the other. The third delay circuit 32 provides a third delay FD1 to the output signal from the first AND gate 26, and outputs the signal as the third control signal φ3H. Accordingly, the latch circuit 18 latches the comparison signal SH outputted from the comparison unit 12, with an elapse of the third delay FD1 from the timing when both the first control signal φ1HP and the second control signal φ1HN are in the hold modes.

Figure 4:
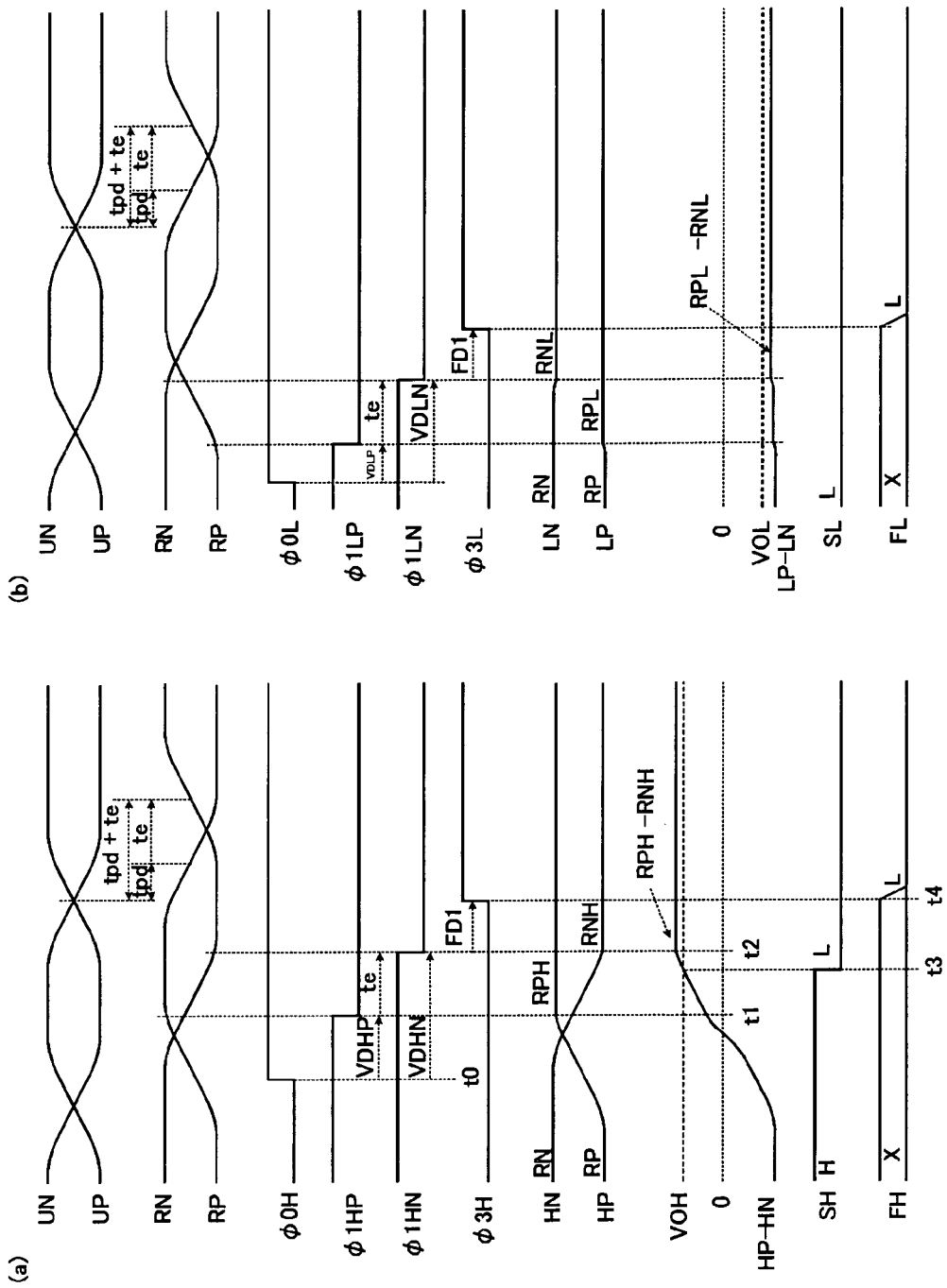
FIGS. 4A and 4B are time charts illustrating performance of the differential comparator in FIG. 3.

The structure of the differential comparator 10H has been described above. Subsequently, performance thereof will be described. FIGS. 4A and 4B are time charts illustrating performance of the differential comparator in FIG. 3. FIG. 4A illustrates performance of the High-side differential comparator 10H, and FIG. 4B illustrates that of the Low-side differential comparator 10L.

Prior to a testing of the DUT 200, it is assumed that a difference between the transmission lengths of the differential signal wires 50P/50N, that is, a propagation time difference te is measured in advance. The error te in the propagation times can be measured by the method disclosed in U.S. Pat. No. 7,121,132. As a result of the measurement, it is assumed that a propagation time through one of the differential signal wires 50 is represented by tpd, and that through the other differential signal wire is represented by tpd+te.

In both of the differential comparator 10H side and the differential comparator 10L side, the first variable delay VDHP (VDLP) and the second variable delay VDHN (VDLN) are set based on a measured error te. Specifically, delay amounts of the first delay circuit 22 and the second delay circuit 24 are adjusted so as to satisfy the following equations:

$$VDHN=VDHP+te$$

$$VDLN=VDLP+te.$$

With this adjustment, the timing when the second control signal φ1HN gives a command for sampling to the second sample hold circuit SH2, lags behind the timing when the first control signal φ1HP gives that to the first sample hold circuit SH1, by the time difference te.

FIG. 4A is now referred to. Before the time t0, the strobe signal φ0H is at the low-level, and the first and the second control signals φ1HP and φ1HN are both at the high-level. During this period, the first and the second sample hold circuits SH1 and SH2 are both set in the tracking mode.

At the time t0, the strobe signal φ0H makes a transition to the high-level. When the first control signal φ1HP makes a transition to the low-level at the time t1 with an elapse of the first variable delay VDHP from the time t0, the first sample hold circuit SH1 is set in the hold mode to sample a value RPH of the differential signal RP and hold it thereafter.

When the second control signal φ1HN makes a transition from the high-level to the low-level, at the time t2 with an elapse of the first variable delay VDHN from the time t0, the second sample hold circuit SH2 is set in the hold mode to sample a value RNH of the differential signal RN and hold it thereafter.

Herein, the differential amplitude signal (HP−HN) outputted from the subtractor 14 is taken into consideration. Values of the differential amplitude signal (HP−HN) change as follows in accordance with the states of the first and the second sample hold circuits SH1 and SH2:

(1) before the time t1
Because HP=RP and HN=RN hold in this state, (HP−HN)=RP−RN holds;

(2) from the time t1 to the time t2

Because the first sample hold circuit SH1 is in the hold mode, and the second sample hold circuit SH2 is in the tracking mode in this state, RP=RPH and HN=RN hold; therefore, (HP−HN)=RPH−RN holds; and (3) after the time t2

Because the first and the second sample hold circuits SH1 and SH2 are both in the hold mode at this state, RP=RPH and HN=RNH hold; therefore, (HP−HN)=RPH−RNH holds.

When the differential amplitude (HP−HN) crosses the threshold voltage VOH, at the time t3 between the time t1 and the time t2, the comparison signal SH makes a transition from the high-level to the low-level.

At the time t4 with a further elapse of the delay time FD3 from the time t2 when the first and the second sample hold circuits SH1 and SH2 are both in the hold mode, the third control signal φ3H makes a transition to the high-level, and the latch circuit 18 latches an output from the comparison unit 12. At the time, the comparison signal SH is at the low-level, and hence a value of the fail signal FH is fixed to the low-level.

As illustrated in FIG. 4B, the differential comparator 10L performs in the same way as with the differential comparator 10H on the basis of the strobe signal φ0L. The fail signal FL at the low-level is generated by the differential comparator 10L.

Advantages offered by the differential comparators 10H and 10L directed to the embodiments, are made clear by comparing them with a conventional differential comparator.

Figure 2:
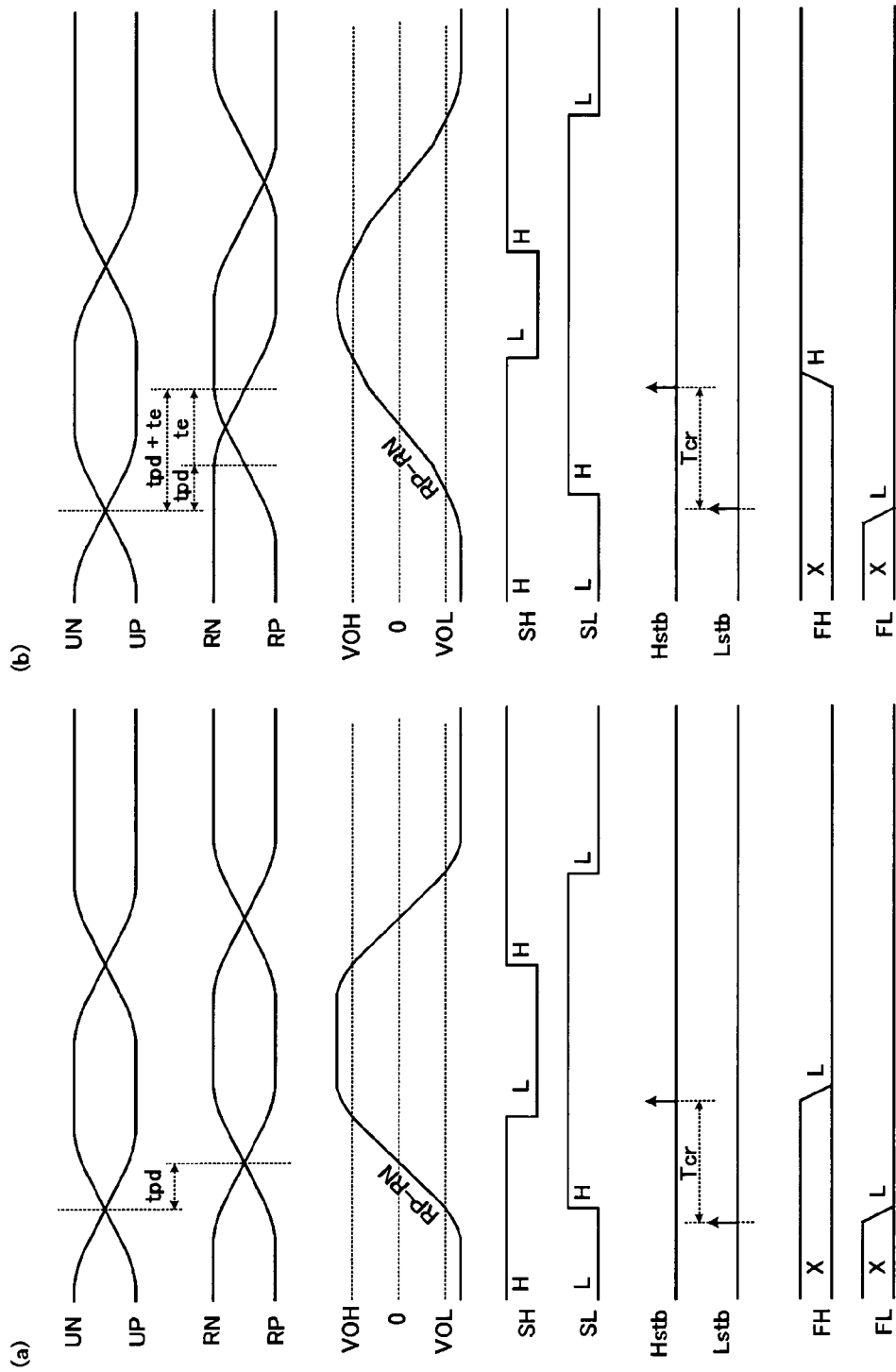
FIGS. 2A and 2B are charts illustrating operation waveforms of differential comparator in the cases where the lengths of differential lines are the same or different, respectively.

In the case where an error between the wire lengths of the differential lines 50P/50N is present, when evaluating the proper differential signals UP/UN by using a conventional circuit illustrated in FIG. 1, the fail signal FH is at the high-level as illustrated in FIG. 2B; hence, there has been a problem that a transition time is determined erroneously not to satisfy the standard.

On the other hand, according to the differential comparators 10H and 10L in FIG. 3, the fail signals FH and FL are both determined to be at the low-level; hence, transition times of the differential signals UP/UN outputted from the DUT 200 can be determined properly to satisfy the standard. That is, even when there is an imbalance between the wire lengths of the differential lines, the differential comparators 10H and 10L can evaluate the differential signals properly by canceling the imbalance, while the differential comparators 10H and 10L serve in the same way as with a conventional differential comparator.

Moreover, the differential comparators 10H and 10L in FIG. 3 can be structured easily with a CMOS process, and therefore, the circuit areas thereof are not increased so much as compared with the differential comparator 110 in FIG. 1.

Figure 5:
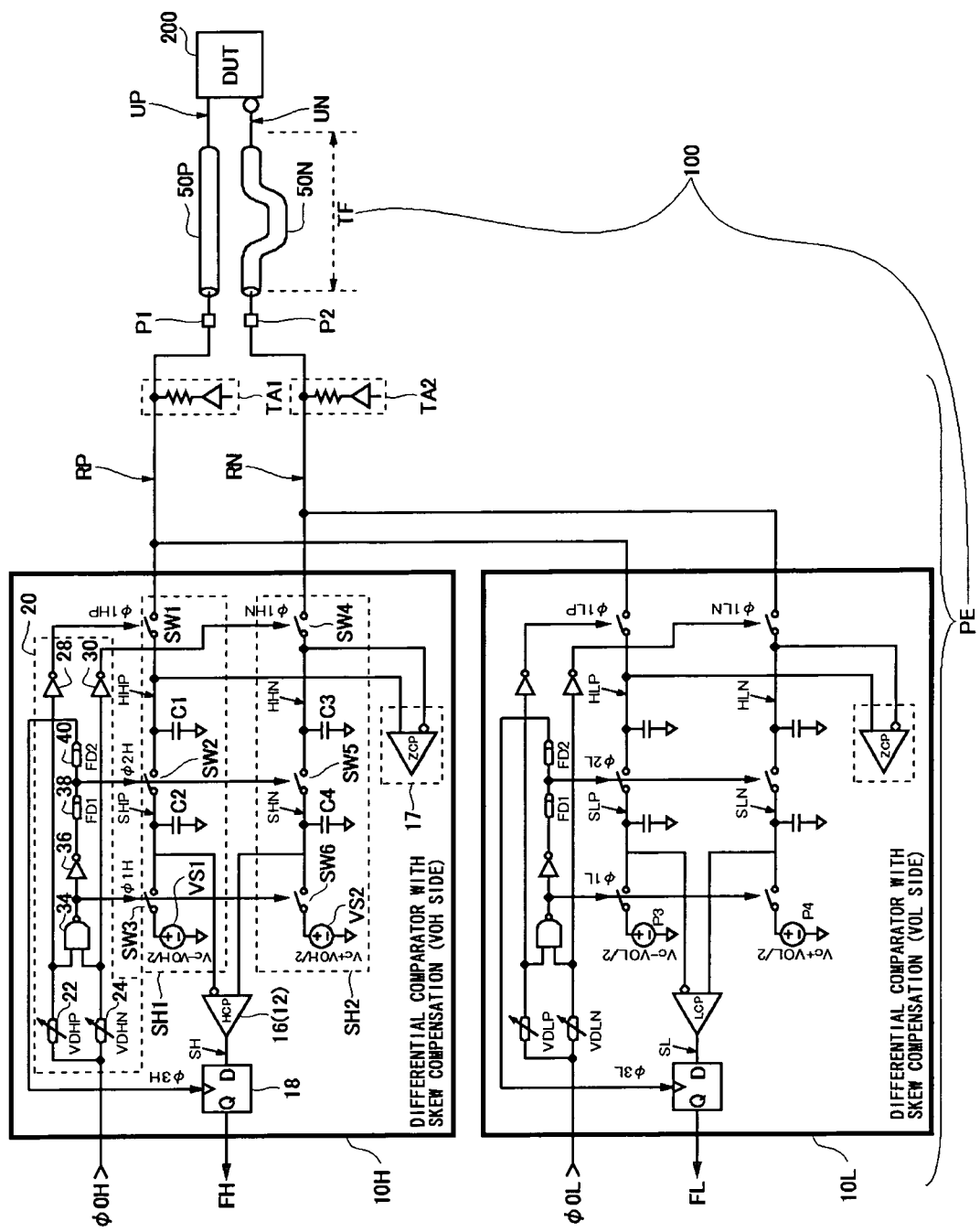
FIG. 5 is a circuit diagram illustrating a first modification example of a differential comparator directed to an embodiment.

FIG. 5 is a circuit diagram illustrating a first modification example of the differential comparator directed to the embodiments. The first and the second sample hold circuits SH1 and SH2 in FIG. 5 have also the function of the subtractor 14 in addition to the functions of the first and the second sample hold circuits SH1 and SH2 in FIG. 3.

The first sample hold circuit SH1 includes a first capacitor C1, a second capacitor C2, a first switch SW1, a second switch SW2, a third switch SW3, and a first voltage source VS1. One of the terminals (first terminal) of the first capacitor C1 is grounded, and its electric potential is fixed. Likewise, one of the terminals (first terminal) of the second capacitor C2 is grounded, and its electric potential is fixed. The first switch SW1 is provided between the other terminal (second terminal) of the first capacitor C1 and the first input terminal P1. The second switch SW2 is provided between the other terminal (second terminal) of the first capacitor C1 and the other terminal (second terminal) of the second capacitor C2. Each capacitance value of the capacitors C1 to C4 is set so as to be identical.

The first voltage source VS1 generates a first reference voltage (Vc−VOH/2) by shifting a predetermined voltage Vc to the lower electric potential side in an amount of an electric potential difference (VOH/2) corresponding to the threshold voltage VOH. The voltage Vc may also be half the voltage of a power source, or a common voltage of the differential signals RP/RN, or another constant voltage. The third switch SW3 is provided between the first voltage source VS1 and the other terminal (second terminal) of the second capacitor C2.

The second sample hold circuit SH2 includes a third capacitor C3, a fourth capacitor C4, a fourth switch SW4, a fifth switch SW5, a sixth switch SW6, and a second voltage source VS2. The structure thereof is the same as with the first sample hold circuit SH1. The second voltage source VS2 generates a second reference voltage (Vc+VOH/2) by shifting the predetermined voltage Vc to the higher electric potential side in an amount of the electric potential difference (VOH/2) corresponding to the threshold voltage VOH.

The timing control unit 20 generates control signals φ1HP, φ1HN, φ2H, φ1H, and φ3H, based on the strobe signal φ0H. The timing control unit 20 includes a first delay circuit 22, a second delay circuit 24, a first inverter 28, a second inverter 30, a NAND gate 34, a third inverter 36, a fourth delay circuit 38, and a fifth delay circuit 40.

The strobe signal φ0H is supplied to the first switch SW1 as the control signal φ1HP via the first delay circuit 22 and the first inverter 28. The strobe signal φ0H is also supplied to the fourth switch SW4 as the control signal φ1HN via the second delay circuit 24 and the second inverter 30.

The NAND gate 34 generates a negative AND of the output signals from the first delay circuit 22 and the second delay circuit 24. An output signal from the NAND gate 34 is supplied to the third switch SW3 and the sixth switch SW6 as the control signal φ1H.

The output signal from the NAND gate 34 is supplied to the second switch SW2 and the fifth switch SW5 as the control signal φ2H via the third inverter 36 and the fourth delay circuit 38. The control signal φ2H is provided with a delay FD2 by the fifth delay circuit 40 such that the control signal φ3H is generated.

Structures of the timing control unit 20 are not limited thereto, but include circuits having the same functions.

The differential comparator 10H is further provided with a dummy comparator 17. An electric potential HHP generated in the first capacitor C1 and an electric potential HHN generated in the third capacitor C3 are inputted to the dummy comparator 17. The dummy comparator 17 is provided in order to balance loads, not to compare voltages. With the dummy comparator 17 provided, the accuracy in processing signals can be dramatically improved, because the first sample hold circuit SH1 and the second sample hold circuit SH2 become symmetrical with the second switch SW2 and the fifth switch SW5 being the axis.

The structures of the differential comparators 10H and 10L in FIG. 5 have been described above. Subsequently, performance thereof will be described.

The first variable delay VDHP (VDLP) and the second variable delay VDHN (VDLN) are set based on the error te in each side of the differential comparators 10H and 10L.

The differential comparator 10H executes the following steps in synchronization with the strobe signal φ0H:

Step 1 (Initialization Mode)

The second switch SW2 is in an off state, and the first switch SW1 and the third switch are in on states, on the side of the first sample hold circuit SH1. As a result, the first capacitor C1 is charged with an electric potential (RP) at the first input terminal P1, and the second capacitor C2 is charged with the first reference voltage (Vc−VOH/2). Further, the fifth switch SW5 is in an off state, and the fourth switch SW4 and the sixth switch SW6 are in on states, on the side of the second sample hole circuit SH2. As a result, the third capacitor C3 is charged with an electric potential (RN) at the second input terminal P2, and the fourth capacitor C4 is charged with the second reference voltage (Vc+VOH/2).

Step 2 (Hold Mode)

The first switch SW1 is turned off at a timing corresponding to the control signal φ1HP on the side of the first sample hold circuit SH1. At the time, the differential signal RP is sampled and held in the first capacitor C1. The third switch SW3 is turned off at a timing corresponding to the control signal φ1H. The fourth switch SW4 is turned off at s timing corresponding to the control signal φ1HN on the side of the second sample hold circuit SH2. At the time, the differential signal RN is sampled and held in the third capacitor C3. Further, the sixth switch SW6 is turned off at a timing corresponding to the control signal φ1H.

Step 3 (Operate Mode)

The second switch SW2 is turned on at a timing corresponding to the control signal φ2H, while the first switch SW1 and the third switch SW3 are in off states, on the side of the first sample hold circuit SH1. As a result, reallocation of charges occurs between the first and the second capacitors C1 and C2, causing the electric potentials HHP and SHP to be averaged.

The fifth switch SW5 is in an on state at a timing corresponding to the control signal φ2H, while the fourth and the sixth switches SW4 and SW6 are in off states, on the side of the second sample hold circuit SH2. As a result, reallocation of charges occurs between the third and the fourth capacitors C3 and C4, causing the electric potentials HHN and SHN to be averaged.

Step 4

The comparator 16 (comparison unit 12) compares a voltage SHP generated in the second capacitor C2 with a voltage SHN generated in the fourth capacitor C4, and generates a comparison signal SH corresponding to the comparison result. The latch circuit 18 latches an output SH from the comparison unit 12 at a timing (φ3H) corresponding to the strobe signal φ0H.

Figure 6:
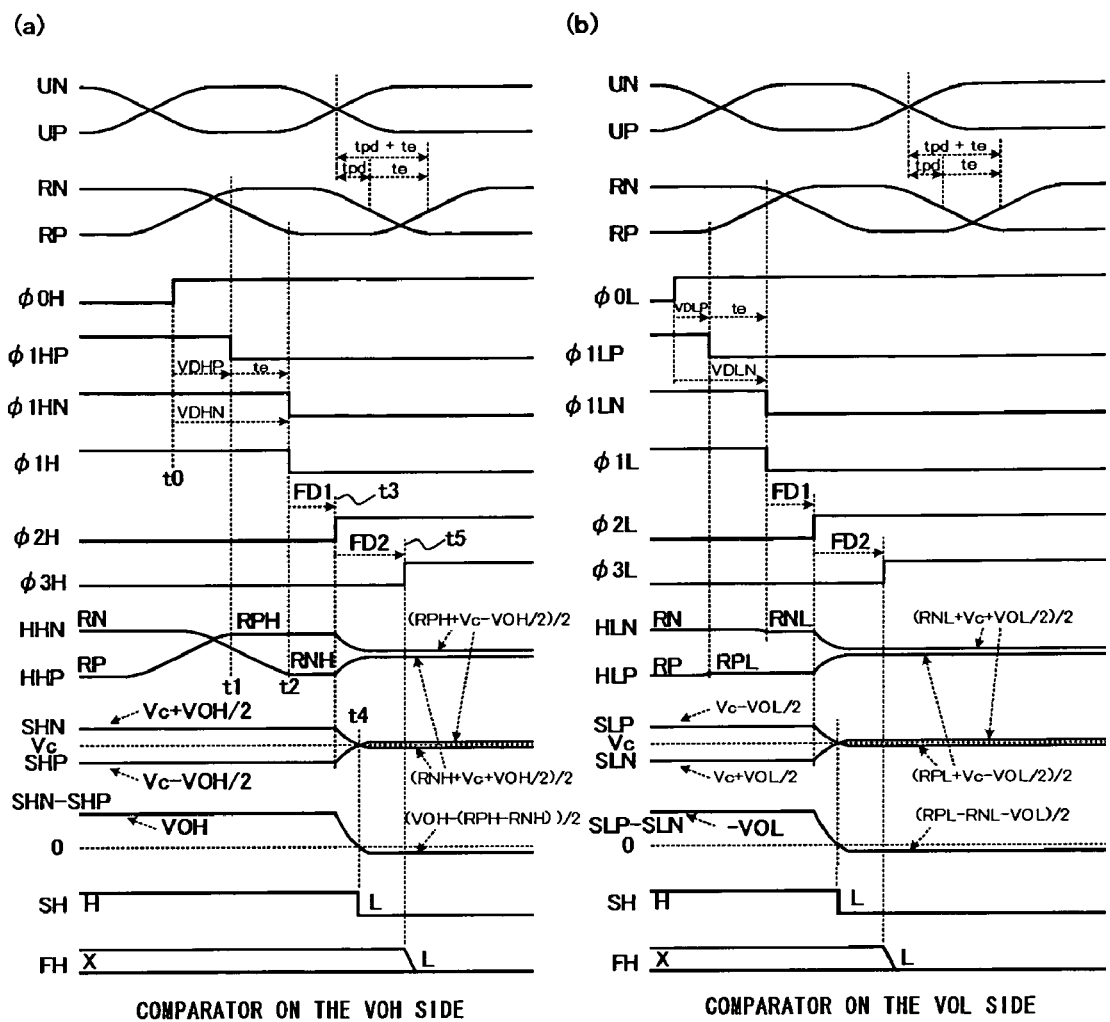
FIGS. 6A and 6B are time charts illustrating performance of the differential comparator in FIG. 5.

The above description can be deeply understood by referring to time charts. FIGS. 6A and 6B are time charts illustrating performance of the differential comparator in FIG. 5. FIG. 6A illustrates performance of the High-side differential comparator 10H, and FIG. 6B illustrates that of the Low-side differential comparator 10L.

FIG. 6A is now referred to. Before the time t0, the strobe signal φ0H is at the low-level, and the control signals φ1HP and φ1HN are both at the high-level. During this period, the capacitors of the first capacitor C1 to the fourth capacitor C4 are charged (step 1).

At the time t0, the strobe signal φ0H makes a transition to the high-level. When the control signal φ1HP makes a transition from the high-level to the low-level, at the time t1 with an elapse of the first variable delay VDHP from the time t0, the first sample hold circuit SH1 samples a value RPH of the differential signal RP and holds it thereafter (step 2).

When the control signal φ1HN makes a transition from the high-level to the low-level, at the time t2 with an elapse of the first variable delay VDHN from the time t0, the second sample hold circuit SH2 samples a value RNH of the differential signal RN and holds it thereafter (step 2).

The control signal φ1H makes a transition to the low-level, and the third switch SW3 and the sixth switch SW6 are turned off, at the time t2 when the first and the second sample hold circuits SH1 and SH2 are both in the hold modes. The control signal φ2H makes a transition to the high-level, and the second and the fifth switches SW2 and SW5 are turned on, at the time t3 with an elapse of the delay time FD1 from the time t2 (step 3).

When the second switch SW2 is turned on, charges are reallocated between the first and the second capacitors C1 and C2, causing the signal RPH thus held and the reference voltage (Vc−VOH/2) to be averaged. The two asymptotically approach each other to be finally settled to (RPH+Vc−VOH/2)/2 (step 3).

When the fifth switch SW5 is turned on, charges are reallocated between the third and the fourth capacitors C3 and C4, causing the signal RNH thus held and the reference voltage (Vc+VOH/2) to be averaged. The two asymptotically approach each other to be finally settled to (RNH+Vc+VOH/2)/2. It is noted that each voltage changes in accordance with the time constant of CR, because the switches including the second switch SW2 and the fifth switch SW5 have on-resistances that are not 0 (step 3).

An electric potential SHP in the second capacitor C2 and an electric potential SHN in the fourth capacitor C4 become identical to each other (intersect each other) at the time t4 during the charge reallocation. At the time t4 when the two electric potentials SHP and SHN intersect each other, the output signal SH from the comparator 16 makes a transition from the high-level to the low-level.

At the time t5 when the control signal φ3H is asserted, the comparison signal SH is latched by the latch circuit 18, such that a value of the fail signal FH is fixed to the low-level (step 4).

As illustrated in FIG. 6B, the differential comparator 10L performs in the same way as with the differential comparator 10H, on the basis of the strobe signal φ0L. The fail signal FL at the low-level is generated by the differential comparator 10L.

As stated above, an imbalance between the wire lengths of the differential lines 50P/50N can be canceled according to the differential comparators 10H and 10L in FIG. 5; hence, pure differential signals UP/UN outputted from the DUT 200 can be properly evaluated.

In addition, the comparator 16 structured with a CMOS circuit sometimes has an input offset voltage of tens to hundreds mV. Accordingly, there is also another advantage that the input offset voltage of the comparator 16 can be preferably canceled by intentionally shifting each reference voltage generated by the first and the second voltage sources VS1 and VS2 so as to be optimized in accordance with the input offset voltage.

Figure 7:
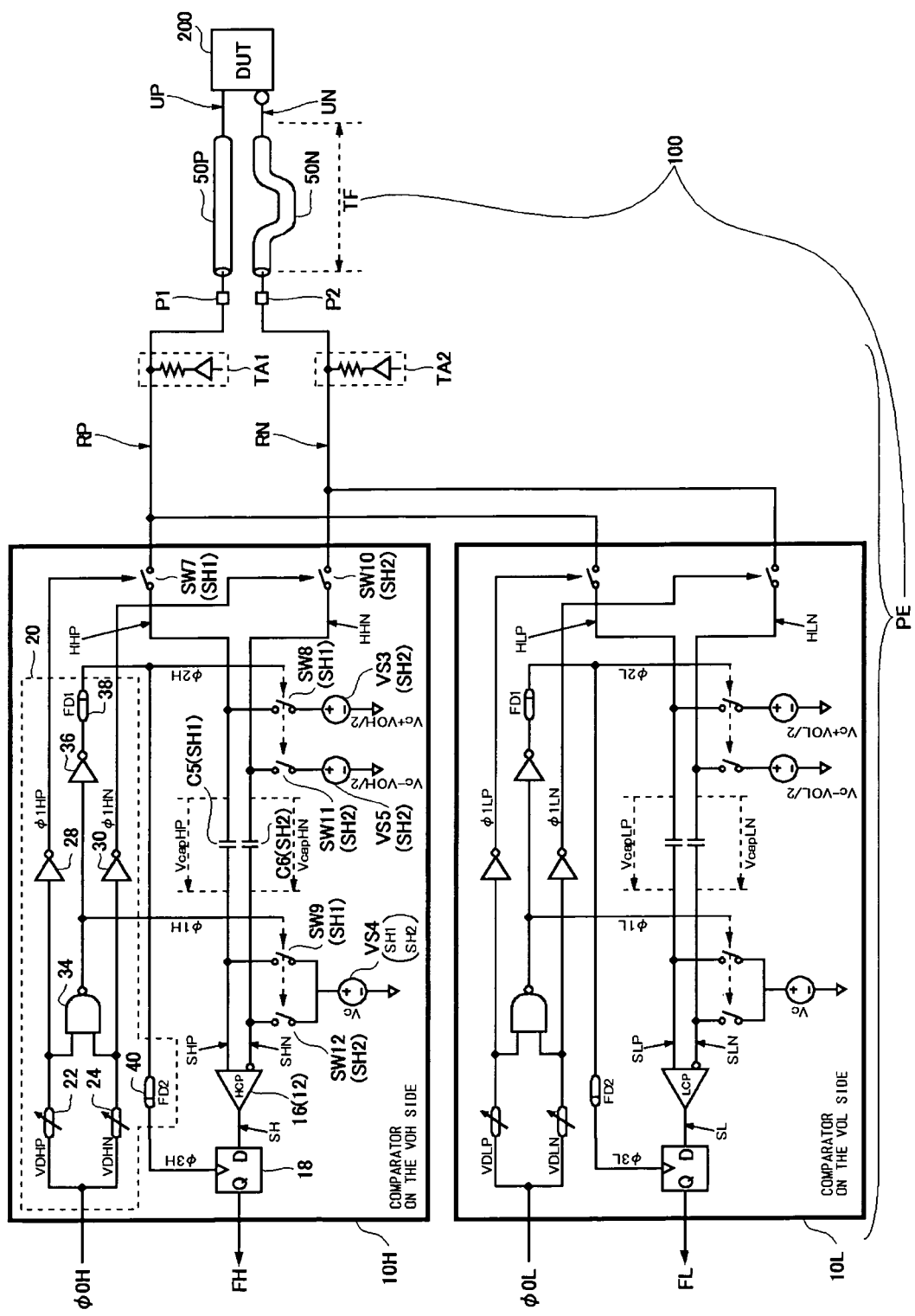
FIG. 7 is a circuit diagram illustrating a second modification example of a differential comparator directed to an embodiment.

FIG. 7 is a circuit diagram illustrating a second modification example of the differential comparator directed to the embodiments. The differential comparator 10H includes a fifth capacitor C5, a sixth capacitor C6, switches from seventh switch SW7 to twelfth switch SW12, a third voltage source VS3, a fourth voltage source VS4, and a timing control unit 20.

The seventh switch SW7, the fifth capacitor C5, the third voltage source VS3, and the fourth voltage source VS4 correspond to the first sample hold circuit SH1.

One end of the seventh switch SW7 is connected to the first input terminal P1. One end (first terminal) of the fifth capacitor C5 is connected to the other end of the seventh switch SW7. The third voltage source VS3 generates a third reference voltage (Vc+VOH/2) by shifting a predetermined voltage Vc to the higher electric potential side in an amount of an electric potential difference (VOH/2) corresponding to the threshold voltage VOH. The eighth switch SW8 is provided between one end of the fifth capacitor C5 and the third voltage source VS3. The fourth voltage source VS4 generates a fourth reference voltage Vc. The ninth switch SW9 is provided between the other end (second terminal) of the fifth capacitor C5 and the fourth voltage source VS4.

Likewise, the eighth switch SW8, the sixth capacitor C6, the fifth voltage source VS5, and the fourth voltage source VS4 correspond to the second sample hold circuit SH2. The topology of the second sample hold circuit SH2 is the same as with the first sample hold circuit SH1.

The timing control unit 20 is structured in the same way as in FIG. 5, and generates the control signals φ1HP, φ1HN, φ2H, φ1H, and φ3H based on the strobe signal φ0H.

The structures of the differential comparators 10H and 10L in FIG. 7 have been described above. Subsequently, performance thereof will be described. The differential comparator 10H executes the following steps in synchronization with the strobe signal φ0H:

Step 1 (Tracking Mode)

The eighth switch SW8 is in an off state, and the seventh switch SW7 and the ninth switch SW9 are in on states, on the side of the first sample hold circuit SH1. As a result, an electric potential (RP) in the first input terminal P1 and the fourth reference voltage Vc are applied to both ends of the fifth capacitor C5 to charge the fifth capacitor C5.

The tenth switch SW10 and the twelfth switch SW12 are in on states, while the eleventh switch SW11 is in an off state, on the side of the second sample hold circuit SH2. As a result, the sixth capacitor C6 is charged.

Step 2 (Hold Mode)

The seventh switch SW7 is turned off at a timing corresponding to the control signal φ1HP, on the side of the first sample hold circuit SH1. At the time, the electric potential HHP at one end of the fifth capacitor C5 is held at the electric potential RPH. The ninth switch SW9 is turned off at a timing corresponding to the control signal φ1H. As a result, the voltage VcapHP in the fifth capacitor C5 is held at (Vc−RPH).

The tenth switch SW10 is turned off at a timing corresponding to the control signal φ1HN, on the side of the second sample hold circuit SH2. At the time, the electric potential HHN at one end of the sixth capacitor C6 is held at the electric potential RNH. The twelfth switch SW12 is turned off at a timing corresponding to the control signal φ1H. As a result, the voltage VcapHN in the sixth capacitor C6 is held at (Vc−RNH).

Step 3 (Operate Mode)

The eighth switch SW8 is turned on at a timing corresponding to the control signal φ2H, while the seventh switch SW7 and the ninth switch SW9 are in off states, on the side of the first sample hold circuit SH1. As a result, the electric potential SHP at the other end of the fifth capacitor C5, is equal to (VcapHP+Vc+VOH/2). The eleventh switch SW11 is turned on at a timing corresponding to the control signal φ2H, while the tenth switch SW10 and the twelfth switch SW12 are in off states, on the side of the second sample hold circuit SH2. As a result, the electric potential SHN at the other end of the sixth capacitor C6 is equal to (VcapHN+Vc−VOH/2).

Step Four

The comparator 16 (comparison unit 12) compares a voltage SHP generated at the other end of the fifth capacitor C5 with a voltage SHN generated in the sixth capacitor C6, and generates a comparison signal SH corresponding to the comparison result. An output SH from the comparator 16 can be given by sign(SHP−SHN)=sign(VOH−(RPH−RNH)), which is equivalent to Equation (1A). The latch circuit 18 latches the output SH from the comparison unit 12 at a timing (φ3H) corresponding to the strobe signal φ0H.

The output SL from the comparator 16 is equal to sign (SLN−SLP)=sign((RPL−RNL)−VOL), which is equivalent to Equation (1b), on the side of the differential comparator 10L.

Figure 8:
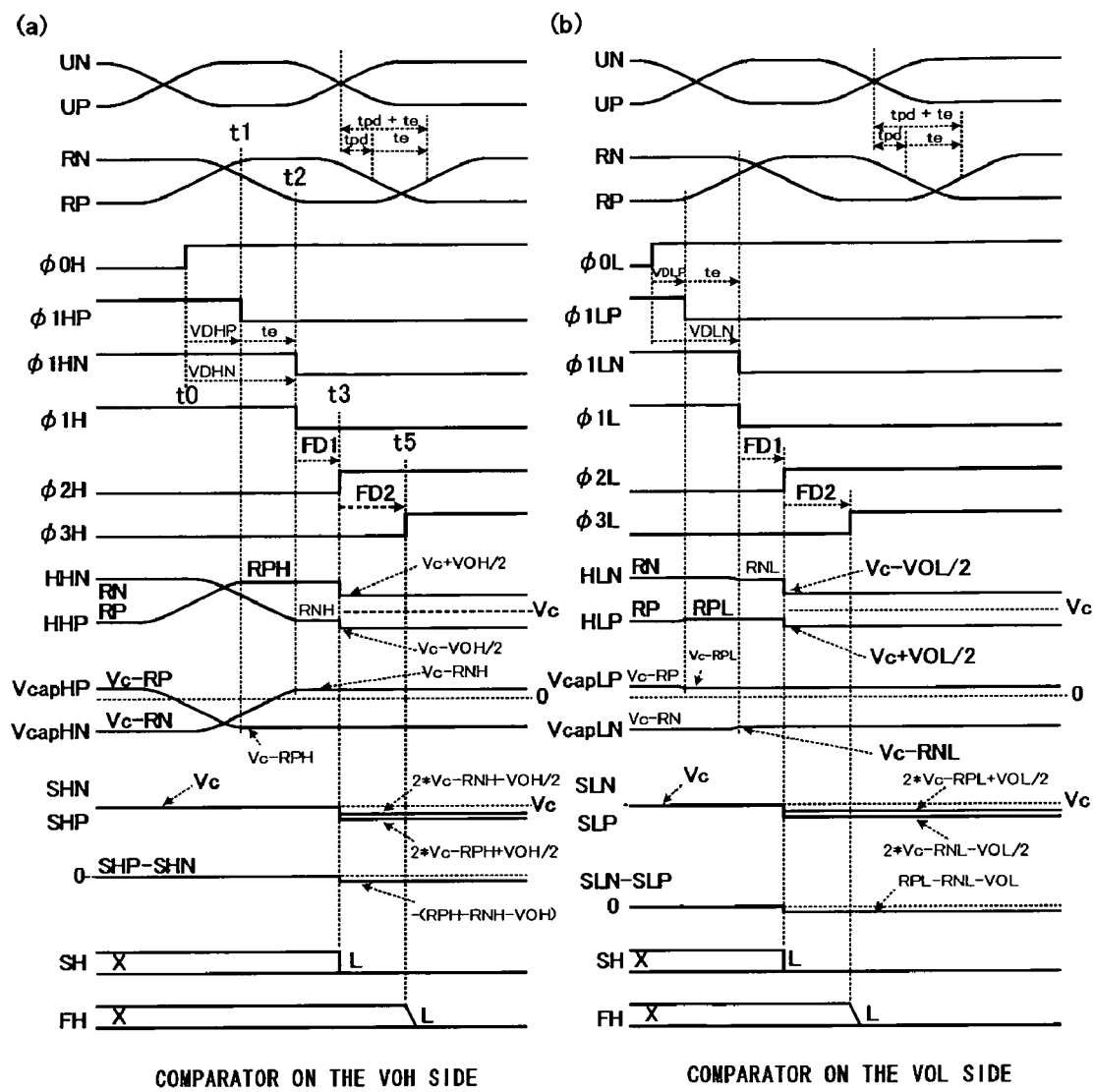
FIGS. 8A and 8B are time charts illustrating performance of the differential comparator in FIG. 7.

The above processing can be deeply understood with reference to time charts. FIGS. 8A and 8B are time charts illustrating performance of the differential comparator in FIG. 7. FIG. 8A illustrates the performance of the High-side differential comparator 10H, and FIG. 8B illustrates that of the Low-side differential comparator 10L.

FIG. 8A is now referred to. Before the time t0, the strobe signal OH is at the low-level, and all of the control signals φ1HP, φHN, and φ1H are at the high-level. During this period, the fifth and the sixth capacitors C5 and C6 are charged (Step 1).

At the time t0, the strobe signal φ0H makes a transition to the high-level. When the control signal φ1HP makes a transition from the high-level to the low-level, at the time t1 with an elapse of the first variable delay VDHP from the time t0, the seventh switch SW7 is turned off. At the time, the electric potential HHP at one end of the fifth capacitor C5 is held at the electric potential RPH (Step 2).

When the control signal φ1HN makes a transition from the high-level to the low-level, at the time t2 with an elapse of the first variable delay VDHN from the time t0, the tenth switch SW10 is turned off, and the electric potential HHN at one end of the sixth capacitor C6 is held at the electric potential RNH (Step 2).

At the time t2, the control signal φ1H makes a transition to the low-level, and the ninth and the twelfth switches SW9 and SW12 are turned off. As a result, the voltage VcapHP in the fifth capacitor C5 and the voltage VcapHN in the sixth capacitor C6 are held (Step 2).

When φ2H makes a transition to the high-level at the time t3, the eight and the eleventh switches SW8 and SW 11 are turned on. Subsequently, levels of the input voltages SHP and SHN in the comparator 16 are shifted to SHP=2×Vc−RPH+ VOH/2, and SHN=2×Vc−RNH−VOH/2, respectively. At the time, an output SH from the comparator 16 makes a transition from an unstable state to the low-level (Step 3).

At the time t5 when the control signal φ3H is asserted, the comparison signal SH is latched by the latch circuit 18, and a value of the fail signal FH is fixed to the low-level.

As illustrated in FIG. 8B, the differential comparator 10L performs in the same as with the differential comparator 10H, on the basis of the strobe signal φ0L. The fail signal FL at the low-level is generated by the differential comparator 10L.

As stated above, according to the differential comparators 10H and 10L in FIG. 7, an imbalance between the wiring lengths of the differential lines can be canceled, such that the differential signals UP/UN from the DUT 200 can be properly evaluated.

Figure 9:
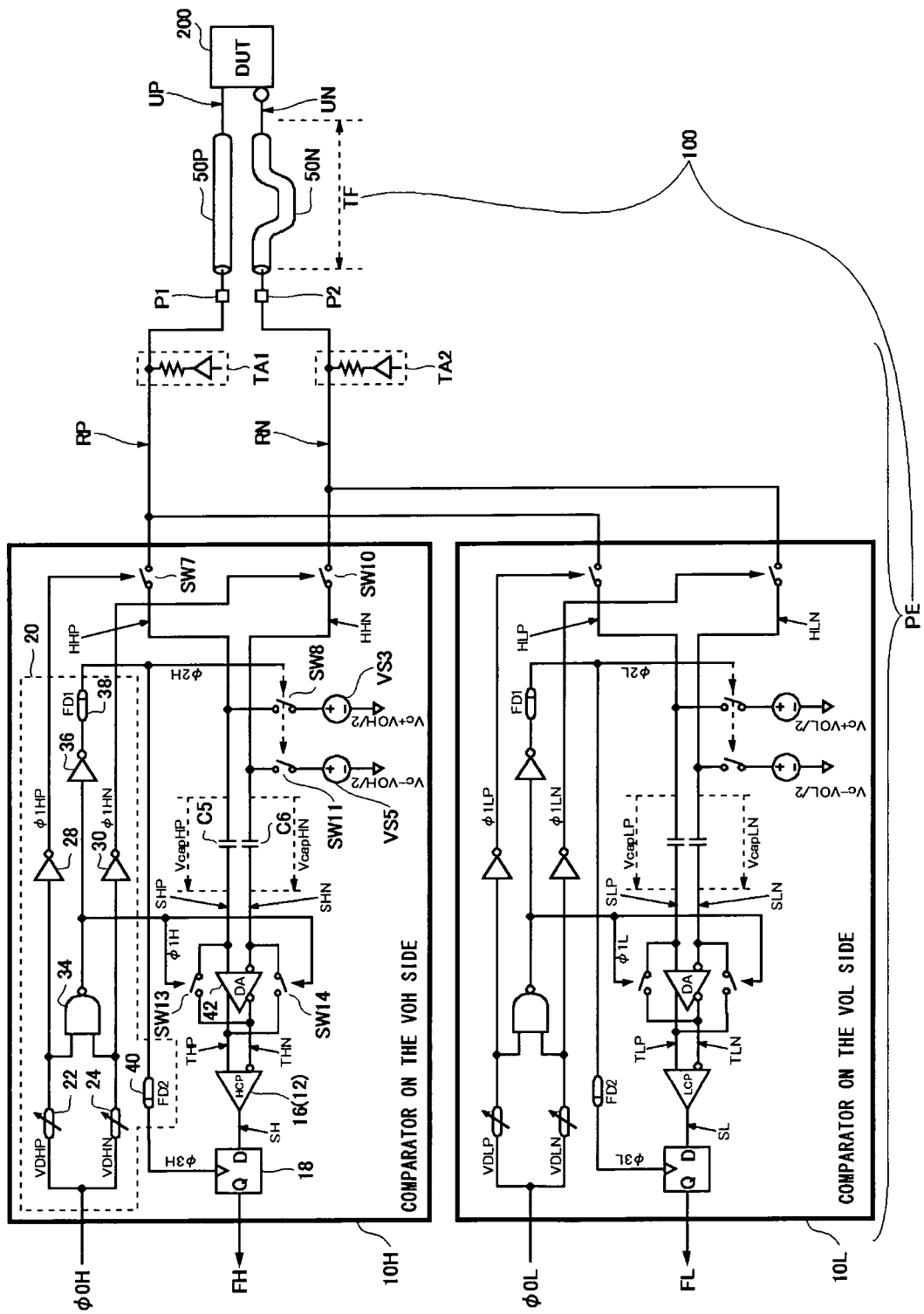
FIG. 9 is a circuit diagram illustrating a third modification example of a differential comparator directed to an embodiment.

FIG. 9 is a circuit diagram illustrating a third modification example of the differential comparator directed to the embodiments. The differential comparator 10H in FIG. 9 is a circuit in which a chopper operational amplifier is used; and includes a differential amplifier 42, a thirteenth switch SW13, and a fourteenth switch SW14, by which the ninth switch SW9, the twelfth switch SW12, and the fourth voltage source VS4 in FIG. 7 are replaced.

The differential amplifier 42 receives the electric potential SHP at the other end of the fifth capacitor C5, in its non-inverted input terminal, and receives the electric potential SHN at the other end of the sixth capacitor C6, in its inverted input terminal; and differentially amplifies the potentials with a gain A.

The thirteenth switch SW13 is provided between the non-inverted input terminal and the inverted output terminal of the differential amplifier 42, and the fourteenth switch SW14 is provided between the inverted input terminal and the non-inverted output terminal of the differential amplifier 42.

The thirteenth and the fourteenth switches SW13 and SW14 are controlled so as to be turned on/off by the control signal $\phi 1H$. Assuming that a non-inverted output from the differential amplifier 42 is denoted by THP, and an inverted output therefrom is by THN, when the thirteenth and the fourteenth switches SW13 and SW14 are turned off, THP=Vc+(SHP−SHN)×A/2 and THN=Vc−(SHP−SHN)× A/2 hold. Further, when the thirteenth and the fourteenth switches SW13 and SW14 are turned on, THP=SHN=Vc and THN=SHP=Vc hold.

The comparator 16 compares the electric potential THP at the non-inverted output terminal of the differential amplifier 42, with the electric potential THN at the inverted output terminal thereof.

The differential comparator 10H in FIG. 9 performs in the same way as with the differential comparator 10H in FIG. 7. Accordingly, an imbalance between the wire lengths of the differential lines can be canceled, and the differential signals UP/UN from the DUT 200 can be properly evaluated.

Figure 10:
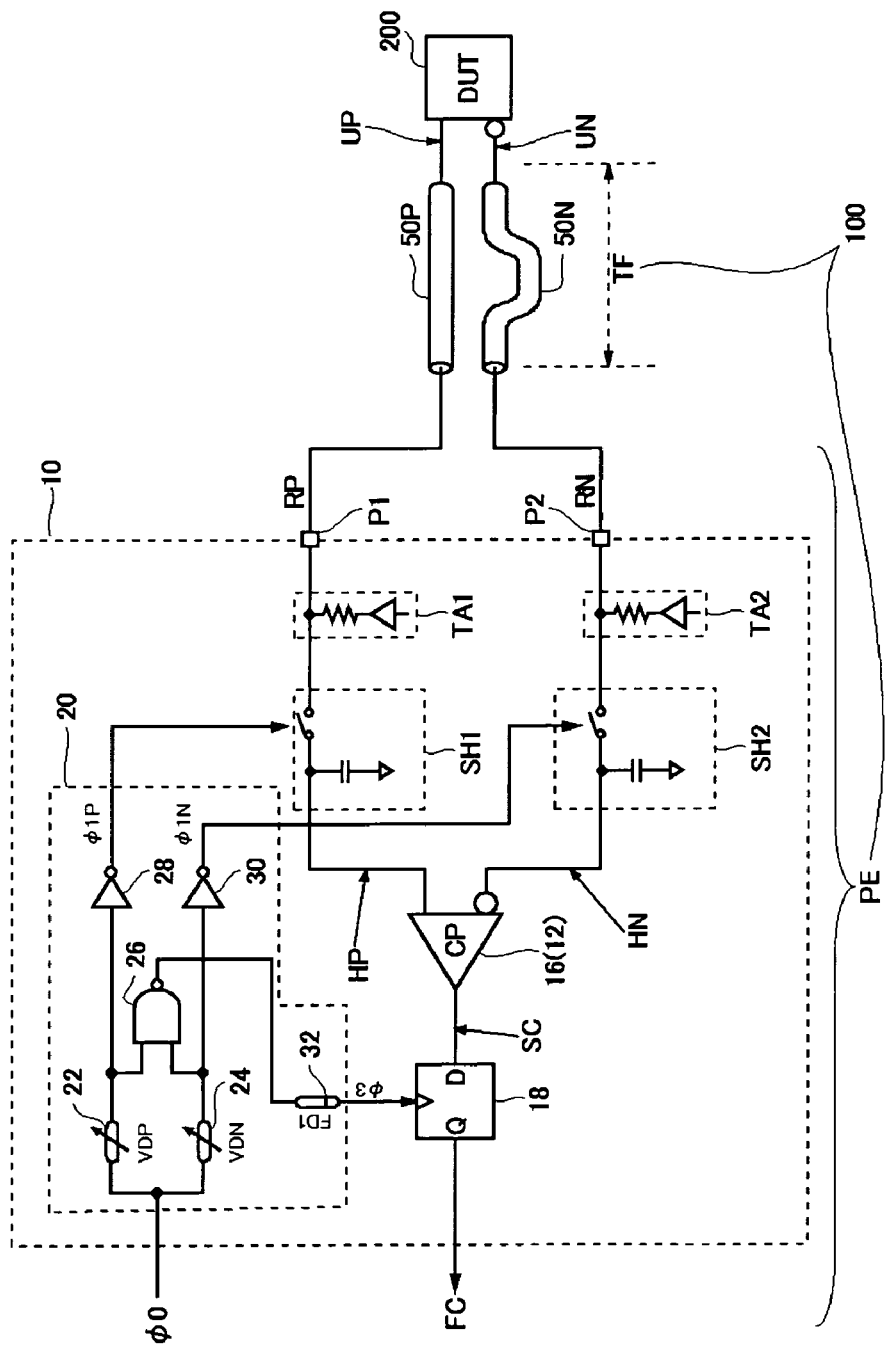
FIG. 10 is a circuit diagram illustrating a fourth modification example of a differential comparator directed to an embodiment.

FIG. 10 is a circuit diagram illustrating a fourth modification example of the differential comparator directed to the embodiments. In some of the embodiments stated above, the differential comparator that compares the differential amplitude (RP−RN), with the higher threshold voltage VOH and the lower threshold voltage VOL, respectively, has been described. On the other hand, FIG. 10 illustrates a structure of the differential comparators when the threshold voltages VOH and VOL are both 0. Such differential comparator 10 determines whether the sign of the differential amplitude signal (RP−RN) is positive or negative, in other words, a magnitude comparison between the differential signals RP/RN.

The differential comparator 10 in FIG. 10 has a structure in which the subtractor 14 is excluded from the differential comparators 10H and 10L in FIG. 3. In other words, the comparator 16 compares the output HP from the first sample hold circuit SH1 with the output HN from the second sample hold circuit SH2. The latch circuit 18 latches the output SC from the comparator 16 at a timing corresponding to the control signal $\phi 3$, and generates the fail signal FC.

Figure 11:
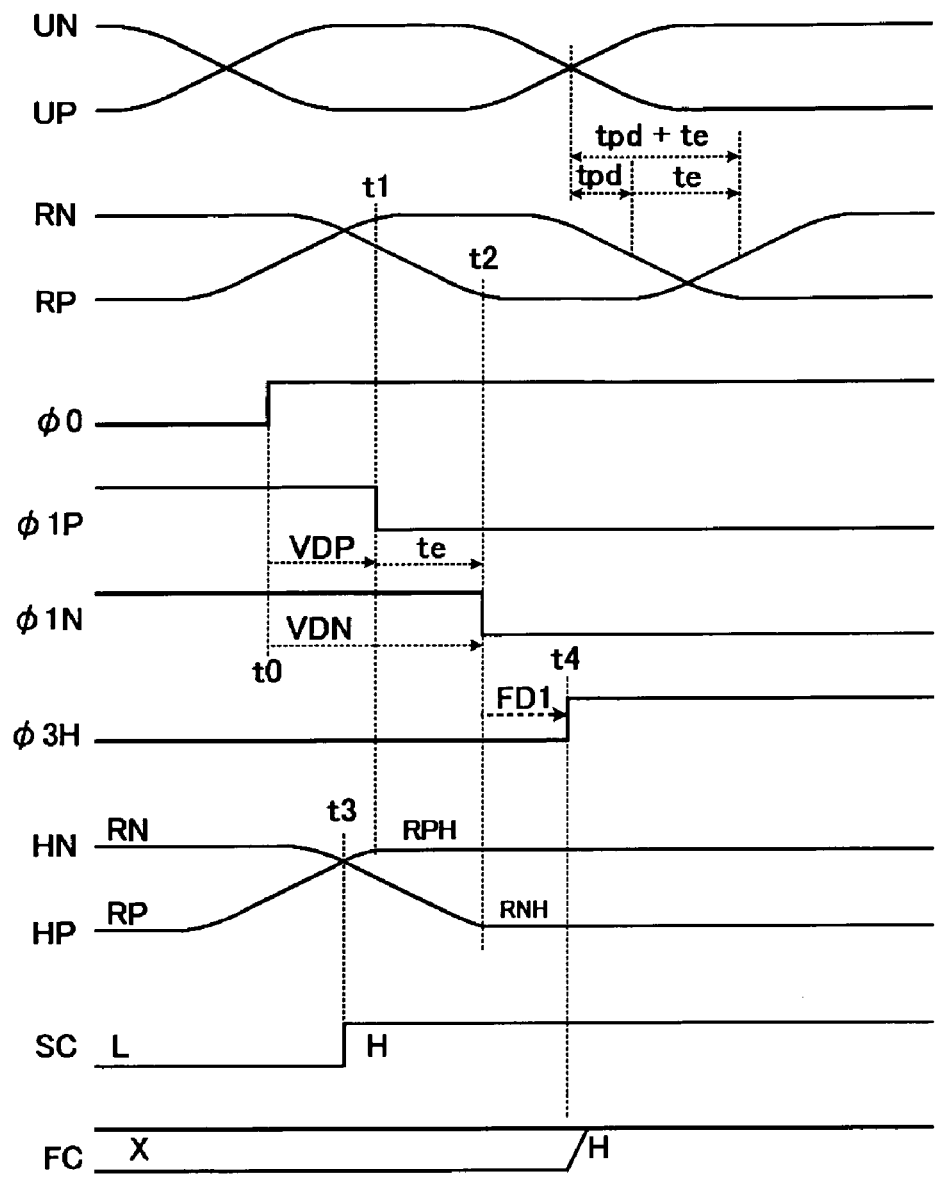
FIG. 11 is a time chart illustrating performance of the differential comparator in FIG. 10.

FIG. 11 is a time chart illustrating performance of the differential comparator in FIG. 10.

Before the time t0, the strobe signal $\phi 0H$ is at the low-level, and therefore the first and the second control signals $\phi 1HP$ and $\phi 1HN$ are both at the high-level. The first and the second sample hold circuits SH1 and SH2 are both set in the tracking mode.

At the time t0, the strobe signal $\phi 0$ makes a transition to the high-level (assert). When the first control signal $\phi 1P$ makes a transition from the high-level to the low-level, at the time t1 with an elapse of the first variable delay VDP from the time t0, the first sample hold circuit SH1 is set in the hold mode to sample a value RPH of the differential signal RP and hold it thereafter.

When the second control signal $\phi 1N$ makes a transition from the high-level to the low-level, at the time t2 with an elapse of the first variable delay VDN from the time t0, the second sample hold circuit SH2 is set in the hold mode to sample a value RNH of the differential signal RN and hold it thereafter.

Before the time t2, the output HP from the first sample hold circuit SH1 and the output from the second sample hold circuit SH2 intersect each other, and the comparison signal SC makes a transition to the high-level. Thereafter, when the control signal $\phi 3H$ is at the high-level at the time t4, a value of the fail signal FC is fixed.

Even when an error is present between the wire lengths of the differential signal wires 50P/50N, influence by the error can be canceled by the differential comparator 10 in FIG. 10, and a cross-point between the differential signals UP/UN outputted from the DUT 200 can be properly evaluated.

While the preferred embodiments of the present invention have been described using specific terms, such description is for illustrative purposes only, and it is to be understood that changes and variations may be made without departing from the spirit or scope of the appended claims.

What is claimed is:

1. A differential comparator that receives differential signals outputted from a device to be tested, and compares a differential amplitude of the differential signals with a threshold voltage, the differential comparator comprising:
    a first input terminal to which one of the differential signals is inputted;
    a second input terminal to which the other of the differential signals is inputted;
    a first sample hold circuit that samples the signal inputted to the first input terminal at a designated timing, and holds it thereafter;
    a second sample hold circuit that samples the signal inputted to the second input terminal at a designated timing, and holds it thereafter;
    a comparison unit that compares a signal corresponding to a difference between respective output signals from the first and the second sample hold circuits, with a predetermined threshold value; and
    a latch circuit that latches an output from the comparison unit, wherein sampling timings of the first and the second sample hold circuits, and a latch timing of the latch circuit, are adjustable independently.

2. The differential comparator according to claim 1, wherein the first sample hold circuit includes:
    a first capacitor an electric potential at one end of which is fixed;
    a second capacitor an electric potential at one end of which is fixed;
    a first switch provided between the other end of the first capacitor and the first input terminal;
    a second switch provided between the other end of the first capacitor and the other end of the second capacitor;
    a first voltage source that generates a first reference voltage by shifting a predetermined voltage in an amount of an electric potential difference corresponding to the threshold voltage; and
    a third switch provided between the first voltage source and the other end of the second capacitor, and wherein the first sample hold circuit executes at respective timings corresponding to a strobe signal:
    a step in which the second switch is in an off state, and the first and the third switches are in on states;
    a step in which the first and the third switches are turned off; and
    a step in which the first and the third switches are in off states, and the second switch is in an on state, and wherein the second sample hold circuit includes:

a third capacitor an electric potential at one end of which is fixed;

a fourth capacitor an electric potential at one end of which is fixed;

a fourth switch provided between the other end of the third capacitor and the second input terminal;

a fifth switch provided between the other end of the third capacitor and the other end of the fourth capacitor;

a second voltage source that generates a second reference voltage by shifting a predetermined voltage in an amount of an electric potential difference corresponding to the threshold voltage; and a sixth switch provided between the second voltage source and the other end of the fourth capacitor, and wherein the second sample hold circuit executes at respective timings corresponding to the strobe signal:

a step in which the fifth switch is in an off state, and the fourth and sixth switches are in on states;

a step in which the fourth and the sixth switches are turned off; and a step in which the fourth and the sixth switches are in off states, and the fifth switch is in an on state, and wherein the comparison unit compares a voltage generated in the second capacitor with a voltage generated in the fourth capacitor, and wherein the latch circuit latches an output from the comparison unit at a timing corresponding to the strobe signal.

3. The differential comparator according to claim 2, wherein the differential comparator further comprises a dummy comparator to which an electric potential generated in the first capacitor and an electric potential generated in the third capacitor are inputted.

4. The differential comparator according to claim 1, wherein the first sample hold circuit includes:

a seventh switch of which one end is connected to the first input terminal;

a fifth capacitor of which one end is connected to the other end of the seventh switch;

a third voltage source that generates a third reference voltage by shifting a predetermined voltage in an amount of an electric potential difference corresponding to the threshold voltage;

an eighth switch provided between the one end of the fifth capacitor and the third voltage source;

a fourth voltage source that generates a fourth reference voltage; and a ninth switch provided between the other end of the fifth capacitor and the fourth voltage source, and wherein the first sample hold circuit executes at respective timings corresponding to a strobe signal:

a step in which the eighth switch is in an off state, and the seventh and the ninth switches are in on states;

a step in which the seventh and the ninth switches are turned off; and a step in which the eighth switch is in an on state while the seventh and the ninth switches are in off states, and wherein the second sample hold circuit includes:

a tenth switch of which one end is connected to the second input terminal;

a sixth capacitor of which one end is connected to the other end of the tenth switch;

a fifth voltage source that generates a fifth reference voltage by shifting a predetermined voltage in an amount of an electric potential difference corresponding to the threshold voltage;

an eleventh switch provided between the one end of the sixth capacitor and the fifth voltage source; and a twelfth switch provided between the other end of the sixth capacitor and the fourth voltage source, and wherein the second sample hold circuit executes at respective timings corresponding to a strobe signal:

a step in which the tenth and the twelfth switches are in on states while the eleventh switch is in an off state;

a step in which the tenth and the twelfth switches are turned off; and a step in which the eleventh switch is in an on state while the tenth and the twelfth switches are in off states, and wherein the comparison unit compares a voltage generated at the other end of the fifth capacitor with a voltage generated at the other end of the sixth capacitor, and wherein the latch circuit latches an output from the comparison unit at a timing corresponding to the strobe signal.

5. The differential comparator according to claim 4, wherein the first and the second sample hold circuits include, instead of the ninth and the twelfth switches and the fourth voltage source:

a differential amplifier that receives the electric potential at the other end of the fifth capacitor and the electric potential at the other end of the sixth capacitor;

a thirteenth switch provided between a non-inverted input terminal and an inverted output terminal of the differential amplifier; and a fourteenth switch provided between an inverted input terminal and a non-inverted output terminal of the differential amplifier, and wherein the comparison unit compares an electric potential at the inverted output terminal with an electric potential at the non-inverted output terminal of the differential amplifier.

6. The differential comparator according to claim 1, wherein the comparison unit compares respective output signals from the first and the second sample hold circuits with each other, instead of comparing a signal corresponding to a difference between the respective output signals from the first and the second sample hold circuits, with a predetermined threshold value.

7. A test apparatus comprising:

a first differential comparator, wherein the first differential comparator is the differential comparator according to claim 1 that receives differential signals outputted from a device to be tested, and compares a differential amplitude of the differential signals with a predetermined higher threshold voltage; and a second differential comparator, wherein the second differential comparator is the differential comparator according to claim 1 that compares the differential amplitude of the differential signals with a predetermined lower threshold voltage.

* * * * *